US007719300B2

(12) United States Patent
Washio et al.

(10) Patent No.: US 7,719,300 B2
(45) Date of Patent: May 18, 2010

(54) METHOD FOR TESTING A SEMICONDUCTOR WAFER AND APPARATUS THEREOF

(75) Inventors: Kenichi Washio, Yokohama (JP); Katsuo Yasuta, Hirosaki (JP); Umenori Sugiyama, Hirakawa (JP)

(73) Assignee: Kabushiki Kaisha Nihon Micronics (JP)

( * ) Notice: Subject to any disclaimer, the term of this patent is extended or adjusted under 35 U.S.C. 154(b) by 264 days.

(21) Appl. No.: 12/044,241

(22) Filed: Mar. 7, 2008

(65) Prior Publication Data

US 2008/0224723 A1 Sep. 18, 2008

(30) Foreign Application Priority Data

Mar. 13, 2007 (JP) ............................. 2007-063315

(51) Int. Cl.
*G01R 31/26* (2006.01)

(52) U.S. Cl. ...................................... 324/765

(58) Field of Classification Search ....................... None
See application file for complete search history.

(56) References Cited

U.S. PATENT DOCUMENTS 6,522,125 B2 * 2/2003 Sagawa ................... 324/158.1

6,728,652 B1 * 4/2004 Kobayashi ................... 702/117
7,371,078 B2 * 5/2008 Ito et al. ....................... 439/73
7,471,077 B2 * 12/2008 Shimada et al. .......... 324/158.1

FOREIGN PATENT DOCUMENTS

| JP | 03-100079 | 11/1992 |
|----|-----------|---------|
| JP | 10-335362 | 6/2000 |
| JP | 11-340329 | 6/2001 |

* cited by examiner

*Primary Examiner*—Jermele M Hollington
(74) *Attorney, Agent, or Firm*—Bruce A. Jagger

(57) ABSTRACT

Reliability of results of a test such as a wafer burn-in test is raised. The present invention is a method for testing a plurality of semiconductor devices in a semiconductor wafer held in a cartridge. Each of the semiconductor devices has electrodes and the cartridge has a lower cartridge portion provided with a chuck holding the semiconductor wafer thereon, and an upper cartridge portion provided with a probe assembly having probes capable of contacting said electrodes. After constituting the cartridge and before placing the cartridge in the thermostatic chamber, a contact check to determine whether or not electrical contact between the electrodes of the semiconductor devices in the cartridge and the probes of the probe assembly is appropriate is performed.

7 Claims, 5 Drawing Sheets

Fig. 4
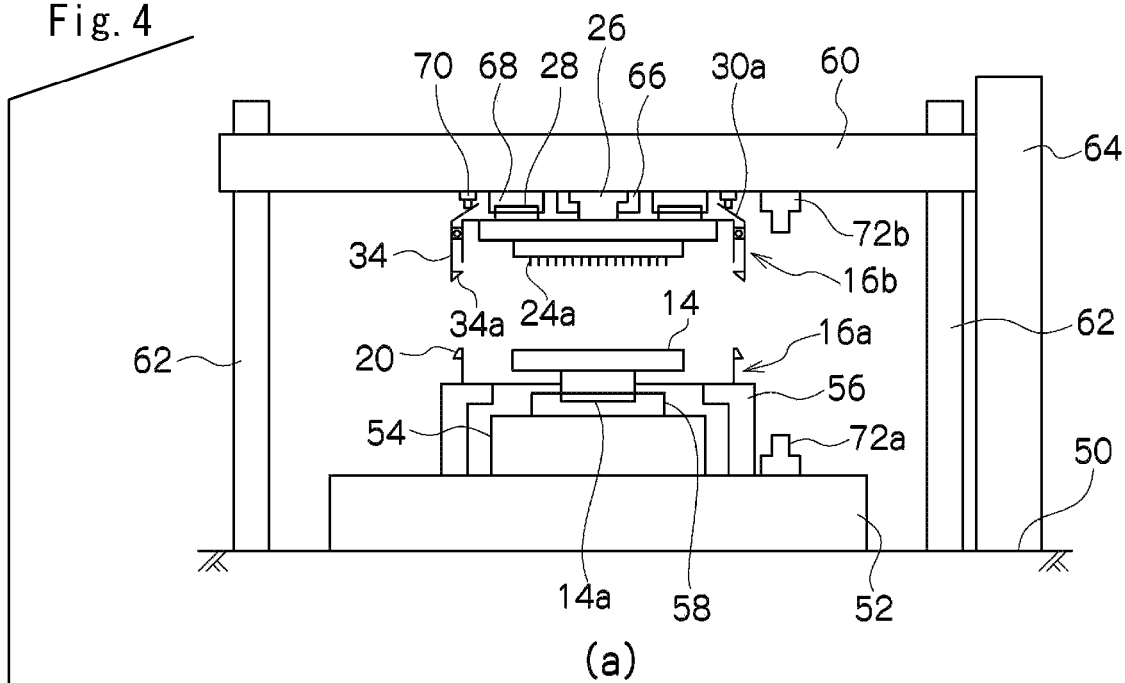
(a)
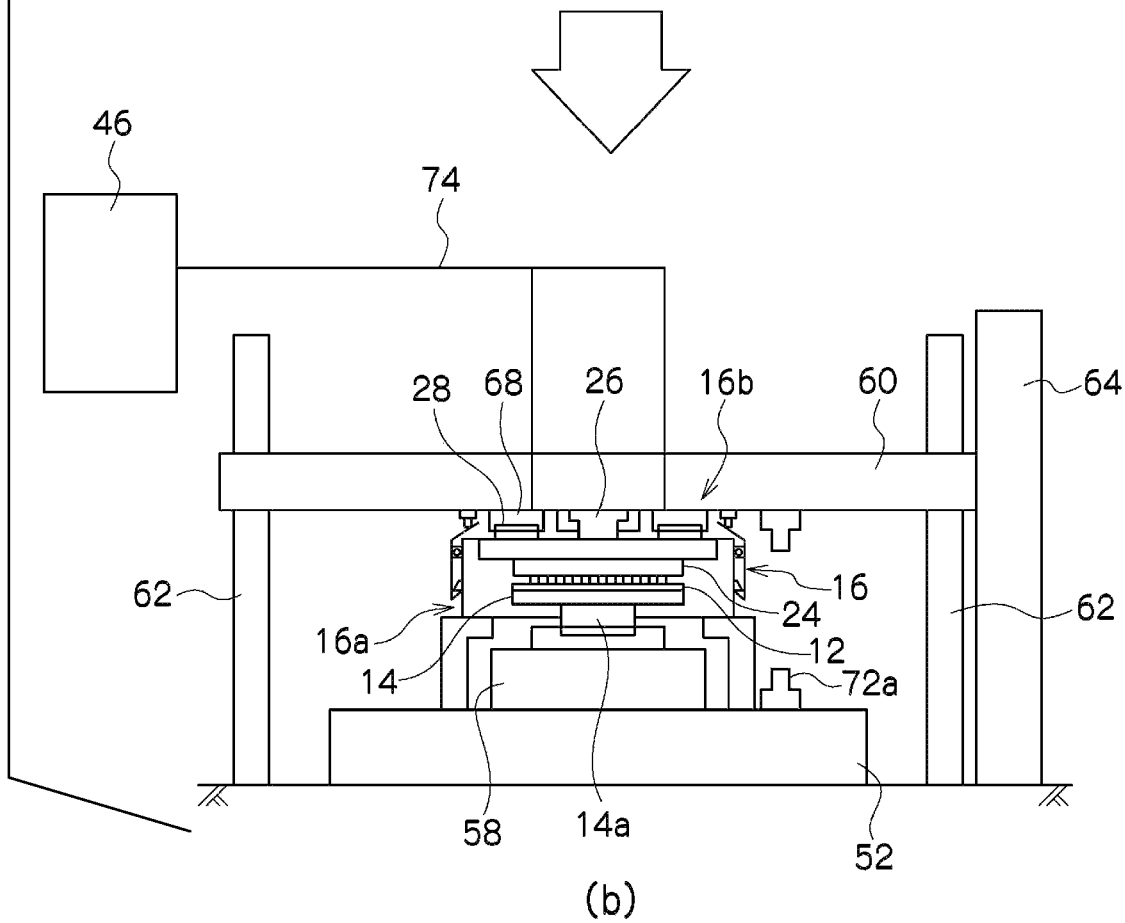
(b)

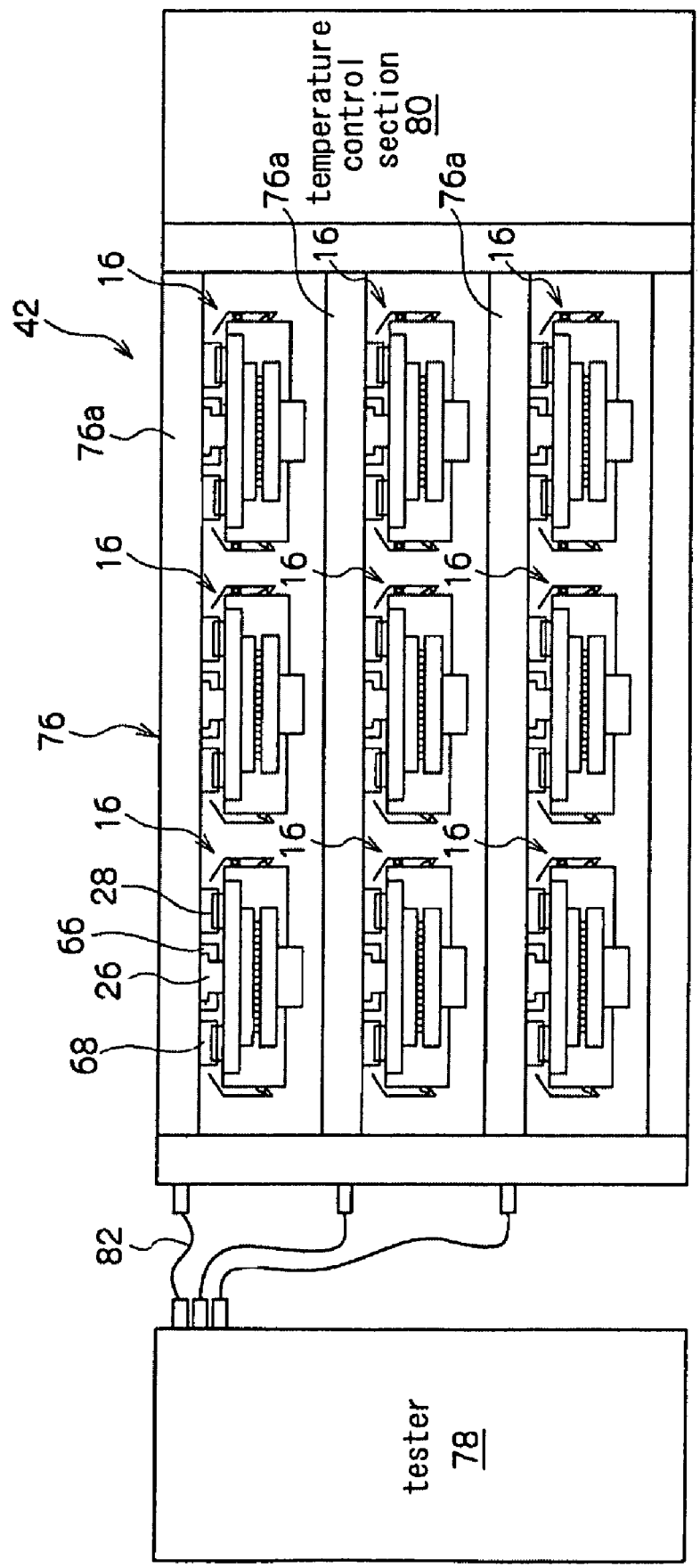

METHOD FOR TESTING A SEMICONDUCTOR WAFER AND APPARATUS THEREOF

RELATED APPLICATIONS

This application claims the benefit of Japanese Patent Application No. 2007-63315, filed Mar. 13, 2007.

BACKGROUND OF THE INVENTION

The present invention relates to a burn-in test method and an apparatus thereof for placing a semiconductor wafer on which a plurality of semiconductor devices are integrated under a high temperature environment and applying voltage to each semiconductor device to screen initial defects of each semiconductor device.

As one of the conventional burn-in tests of semiconductor devices, there exists a method for performing a burn-in test in a semiconductor wafer state prior to separation of the semiconductor wafer on which a plurality of semiconductor devices are integrated into respective devices (e.g., refer to Patent Document 1). Such a burn-in test in a semiconductor wafer state is referred to as a wafer burn-in test.

In this wafer burn-in test, a cartridge housing a device under test with a lower cartridge portion provided with a chuck holding a semiconductor wafer as a device under test and an upper cartridge portion including a probe assembly provided with probes that can contact electrodes of the semiconductor wafer held on the chuck of the lower cartridge portion is constituted. This cartridge is placed in a thermostatic chamber in a state of holding the semiconductor wafer as a device under test therein, and a tester is connected to each cartridge. By doing so, a semiconductor wafer in each cartridge undergoes a wafer burn-in test.

Also, it is proposed that a lower cartridge portion and an upper cartridge portion are set as a cartridge in advance, and a semiconductor wafer as a device under test is built in these set lower cartridge portion and upper cartridge portion by an assembling/disassembling apparatus for simplification of the process of a wafer burn-in test and simplification of a test apparatus (e.g., refer to Patent Document 2). Further, an apparatus for automating assembly and disassembly of a cartridge and building and taking a semiconductor wafer in and out of the cartridge in relation to these is proposed (e.g., refer to Patent Document 3).

According to the aforementioned conventional burn-in test methods, as far as the electrodes of each semiconductor device of the semiconductor wafer as a device under test contact the respective probes of the probe assembly appropriately in the cartridge consisting of the lower cartridge portion and the upper cartridge portion, the semiconductor wafer is placed in the thermostatic chamber in a state of being connected to the tester appropriately. Thus, an appropriate burn-in test can be performed efficiently.

[Patent Document 1] Japanese Patent Appln. Public Disclosure No. H4-329653
[Patent Document 2] Japanese Patent Appln. Public Disclosure No. H2000-164654
[Patent Document 3] Japanese Patent Appln. Public Disclosure No. H2001-156129

BRIEF SUMMARY OF THE INVENTION

However, if the electrodes of each semiconductor device of the semiconductor wafer do not contact the corresponding probes of the probe assembly appropriately in the cartridge, reliability of the results of the burn-in test is lowered.

It is an object of the present invention to raise reliability of results of a test such as a wafer burn-in test.

The present invention is a method for testing a plurality of semiconductor devices in a semiconductor wafer held in a cartridge, wherein each of said semiconductor devices has electrodes and said cartridge has a lower cartridge portion provided with a chuck holding said semiconductor wafer thereon, and an upper cartridge portion provided with a probe assembly having probes capable of contacting said electrodes, said cartridge being constituted by coupling said lower cartridge portion and upper cartridge portion, and then said cartridge being placed in a thermostatic chamber in a state of being connected to a tester, characterized by performing a contact check, after said cartridge is constituted and before said cartridge is disposed in said thermostatic chamber, to determine whether not there is an adequate electrical contact between said electrodes of said semiconductor devices within said cartridge and the probes of said probe assembly.

In the method according to the present invention, after constitution of the cartridge, whether or not connection between the electrodes formed on each semiconductor device of the semiconductor wafer in the cartridge and the probes of the probe assembly is appropriate is determined. By this determination, only the cartridges whose connection is determined to be appropriate can be placed in the thermostatic chamber for, e.g., a burn-in test. Accordingly, conventional erroneous determination caused by connection defects of the probes can be prevented reliably, and reliability of results of a test such as a burn-in test can be raised.

When appropriate electrical contact cannot be obtained in the contact check, the upper cartridge portion may be separated from the cartridge, the probes of the upper cartridge portion may be cleaned, then a cartridge including the upper cartridge portion may be constituted again, and the contact check may be performed.

In the contact check, when the electrode to be checked is a signal electrode, the probe corresponding to the signal electrode may be supplied with predetermined current, voltage of the signal electrode at the time may be detected, and based on the detected voltage, whether or not contact between the signal electrode and the probe corresponding to this is appropriate may be determined.

Also, when the electrode to be checked is a power electrode, predetermined power voltage may be applied to the probe corresponding to the power electrode, power current at the time may be detected, and based on the detected current, whether or not contact between the power electrode and the probe corresponding to this is appropriate may be determined.

By using a multichannel tester having measurement channels respectively corresponding to plural cartridges as the tester, the plural cartridges may be arranged in the thermostatic chamber, and a test such as a burn-in test may be performed to each semiconductor wafer housed in each cartridge in parallel.

A test apparatus according to the present invention comprises an alignment stage forming a cartridge by coupling a lower cartridge portion provided with a chuck holding a semiconductor wafer on which semiconductor devices having electrodes are integrated with an upper cartridge portion provided with a probe assembly having probes that can contact the electrodes formed on the semiconductor devices of the semiconductor wafer held on the chuck of the lower cartridge portion and a test station having a thermostatic chamber housing the cartridge formed in the alignment stage and a tester performing an electrical test of the semiconductor devices of the semiconductor wafer housed in the cartridge in the thermostatic chamber, and is characterized in that the alignment stage is provided with a contact tester to determine whether or not electrical contact between the electrodes of the semiconductor devices integrated on the semiconductor wafer in each cartridge and the probes of the probe assembly is appropriate.

With the test apparatus according to the present invention, the test method according to the present invention can be performed easily and efficiently.

A cleaning station for cleaning the probe when appropriate electrical contact cannot be obtained in a contact check by the contact tester may be provided.

With the present invention, as described above, after constitution of the cartridge, only the cartridges whose connection is determined to be appropriate can be placed in the thermostatic chamber for a burn-in test by execution of the contact check. Accordingly, conventional erroneous determination caused by connection defects of the probes can be prevented reliably, and reliability of results of a test such as a burn-in test can be raised.

BRIEF DESCRIPTION OF THE DRAWINGS

FIGS. 4(a) and 4(b) are schematic diagrams showing a coupling operation and a contact check operation of the cartridge on the alignment stage shown in FIG. 3.

FIG. 5 is a schematic diagram showing a configuration of a test station used in the burn-in test apparatus shown in FIG. 1.

DETAILED DESCRIPTION OF THE INVENTION

Figure 1:
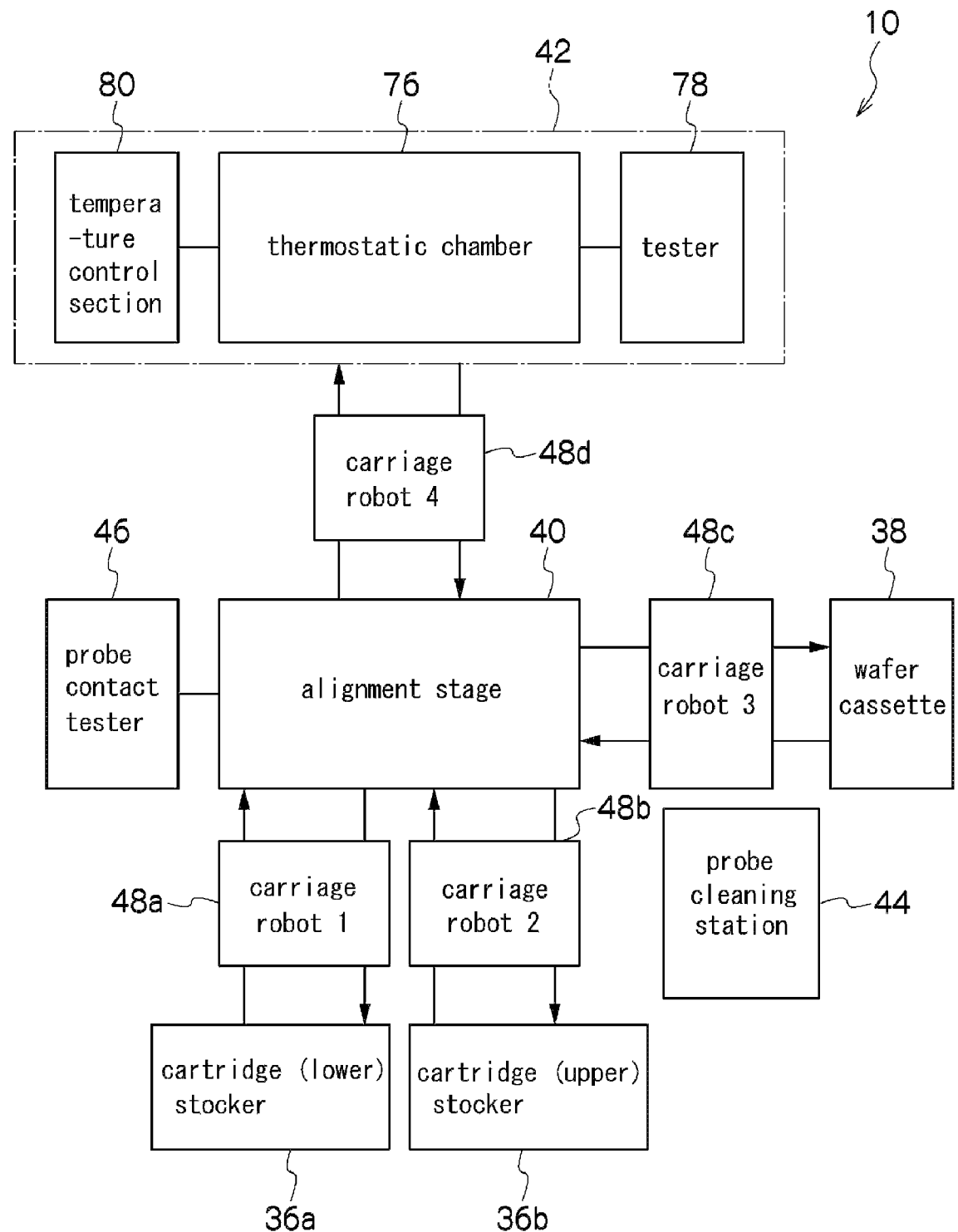
FIG. 1 is a block diagram showing a configuration of a burn-in test apparatus according to the present invention.
Figure 2:
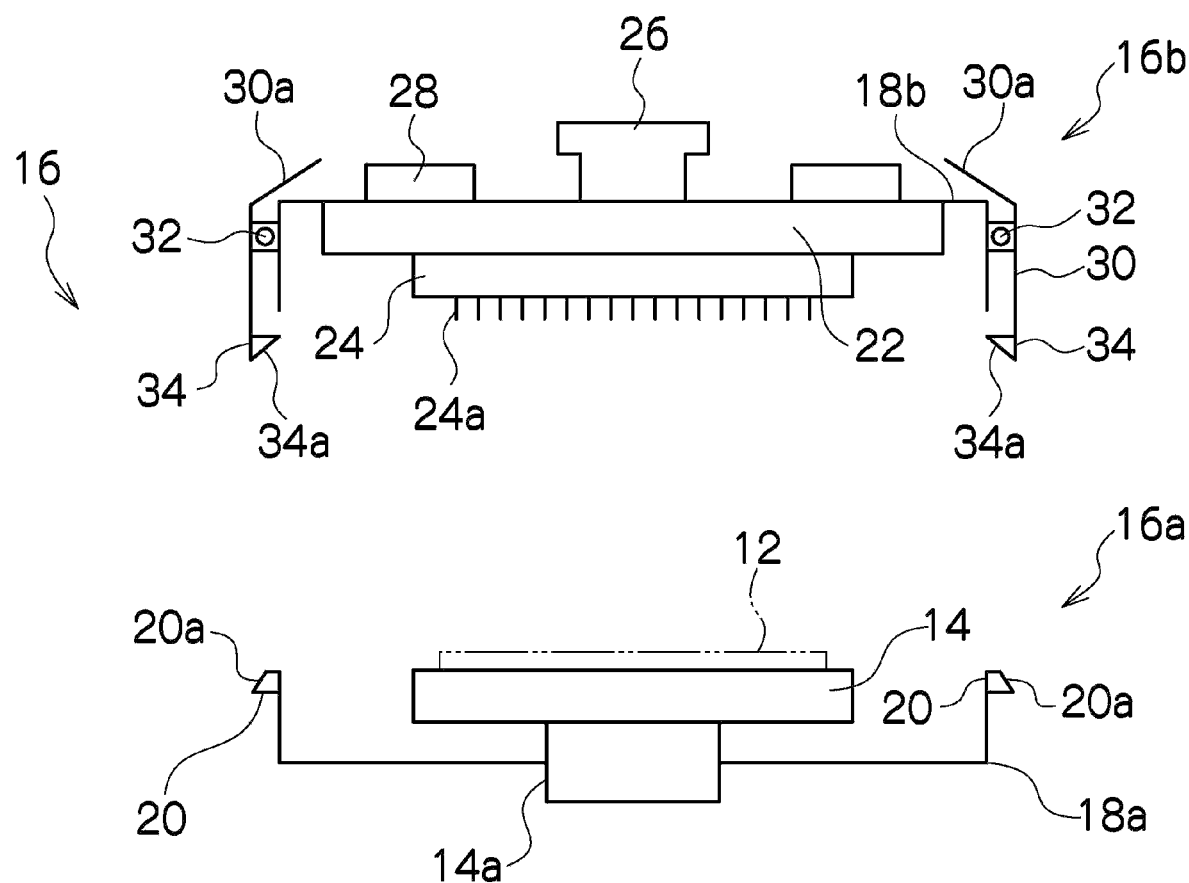
FIG. 2 is a schematic diagram showing a cartridge used in the burn-in test apparatus shown in FIG. 1.

FIG. 1 shows a block diagram of a burn-in test apparatus 10 performing a burn-in test according to the present invention. In this burn-in test apparatus 10, a semiconductor wafer 12 as a device under test is handled in a state of being housed in a cartridge 16 constituted by a lower cartridge portion 16a provided with a wafer chuck 14 and an upper cartridge portion 16b to be coupled with the lower cartridge portion, as shown in FIG. 2. On the semiconductor wafer 12, a plurality of semiconductor devices are integrated collectively, although not shown in the figure.

The lower cartridge portion 16a has a dish-shaped circular housing 18a, whose upper edge is opened, referred to as a tray. In the circular housing 18a, the aforementioned wafer chuck 14 is rotatably supported around its rotation axis 14a. The wafer chuck 14 holds the semiconductor wafer 12 by, for example, suction negative pressure with a plurality of electrodes formed on its semiconductor device directing upward. At the rim portion of the circular housing 18a are formed lock portions 20 for locking the upper cartridge portion 16b. To the circumferential surface of each lock portion 20 is attached a taper 20a tapered toward the opened edge of the circular housing 18a.

The upper cartridge portion 16b has a circular housing 18b whose lower edge is opened. The circular housing 18b of the upper cartridge portion 16b can be fitted on the circular housing 18a so as to cover the opening of the circular housing 18a of the lower cartridge portion 16a. In the circular housing 18b of the upper cartridge portion 16b, a probe assembly 24 is attached via a connection board 22. On the probe assembly 24 are provided a plurality of probes 24a whose tips can contact the plurality of electrodes of the semiconductor device integrated on the semiconductor wafer 12 on the wafer chuck 14.

At the center portion of the outer surface of the circular housing 18b is formed a knob 26 as an attachment portion of the cartridge 16. Also, on the aforementioned outer surface of the circular housing 18b are provided a plurality of electrical connectors 28 to surround the knob 26. Each probe 24a of the probe assembly 24 is connected to each corresponding electrical connector 28 via a conductive path (not shown) formed in the connection board 22.

At the opening rim portion of the circular housing 18b are swingably supported via axes 32 hook arms 30 each constituting a lock mechanism in collaboration with the lock portion 20 of the lower cartridge portion 16a. At the lower edge of each hook arm 30 is formed a hook portion 34 that can catch the corresponding lock portion 20, and at the hook portion is formed a taper 34a corresponding to the taper 20a of the lock portion 20. In each axis 32 of the hook arm 30 is built, for example, a torsion spring (not shown) that gives each hook arm 30 a spring force in a direction in which the hook portion 34 is locked by the corresponding lock portion 20.

Accordingly, as shown in FIG. 2, when the opened edge of the lower cartridge portion 16a and the opened edge of the upper cartridge portion 16b are approached to each other so as to be fitted to each other in a state where the semiconductor wafer 12 is held on the wafer chuck 14, the look portion 34 gets over the lock portion 20, overcoming the spring force of the aforementioned torsion coil spring due to a guide effect of the tapers 20a and 34a of the lock portion 20 and the hook portion 34. Also, when the hook portion 34 gets over the lock portion 20, the hook portion 34 of the hook arm 30 of the upper cartridge portion 16b is held at a lock position by the lock portion 20 of the lower cartridge portion 16a.

By the lock mechanism including this hook arm 30, the both cartridge portions 16a, 16b are coupled with each other, and by the coupling of the both cartridge portions 16a, 16b, the cartridge 16 housing the semiconductor wafer 12 is formed. The semiconductor wafer 12 in the cartridge 16 is held in a state where the respective electrodes of the semiconductor device formed thereon contact the corresponding probes 24a of the probe assembly 24.

Also, in the cartridge 16, by pushing an upper edge 30a of each hook arm 30 downward, one can turn the hook arm 30, overcoming the aforementioned spring force so as to release the engagement between the hook portion 34 and the lock portion 20. Thus, by the operation of the hook arm 30, one can separate the cartridge 16 into the lower cartridge portion 16a and the upper cartridge portion 16b.

Referring to FIG. 1 again, the burn-in test apparatus 10 comprises a first cartridge stocker 36a and a second cartridge stocker 36b respectively housing the aforementioned lower cartridge portion 16a and the upper cartridge portion 16b, a wafer cassette 38 housing the semiconductor wafer 12 as a device under test, an alignment stage 40 mainly assembling and disassembling the cartridge 16, and a test station 42. Also, in relation to the alignment stage 40, it is provided with a cleaning station 44 cleaning the tips of the probes 24a provided at each upper cartridge portion 16b and a contact tester 46 testing electrical connection between the probes 24a of the probe assembly 24 and the electrodes of the semiconductor wafer 12.

Between the first and second cartridge stockers 36a and 36b and the alignment stage 40 are provided first and second carriage robots 48a, 48b for carriage and handling of the lower cartridge portion 16a and the upper cartridge portion 16b. Also, between the wafer cassette 38 and the alignment stage 40 is provided a third carriage robot 48c for carriage and handling of the semiconductor wafer 12. Further, between the alignment stage 40 and the test station 42 is provided a fourth carriage robot 48d for carriage and handling of the cartridge 16 formed at the alignment stage 40.

The alignment stage 40 is supplied with the lower cartridge portion 16a and the upper cartridge portion 16b from the first and second cartridge stockers 36a and 36b by the first and second carriage robots 48a, 48b, respectively. Also, the alignment stage 40 is supplied with the semiconductor wafer 12 from the wafer cassette 38 by the third carriage robot 48c.

Figure 3:
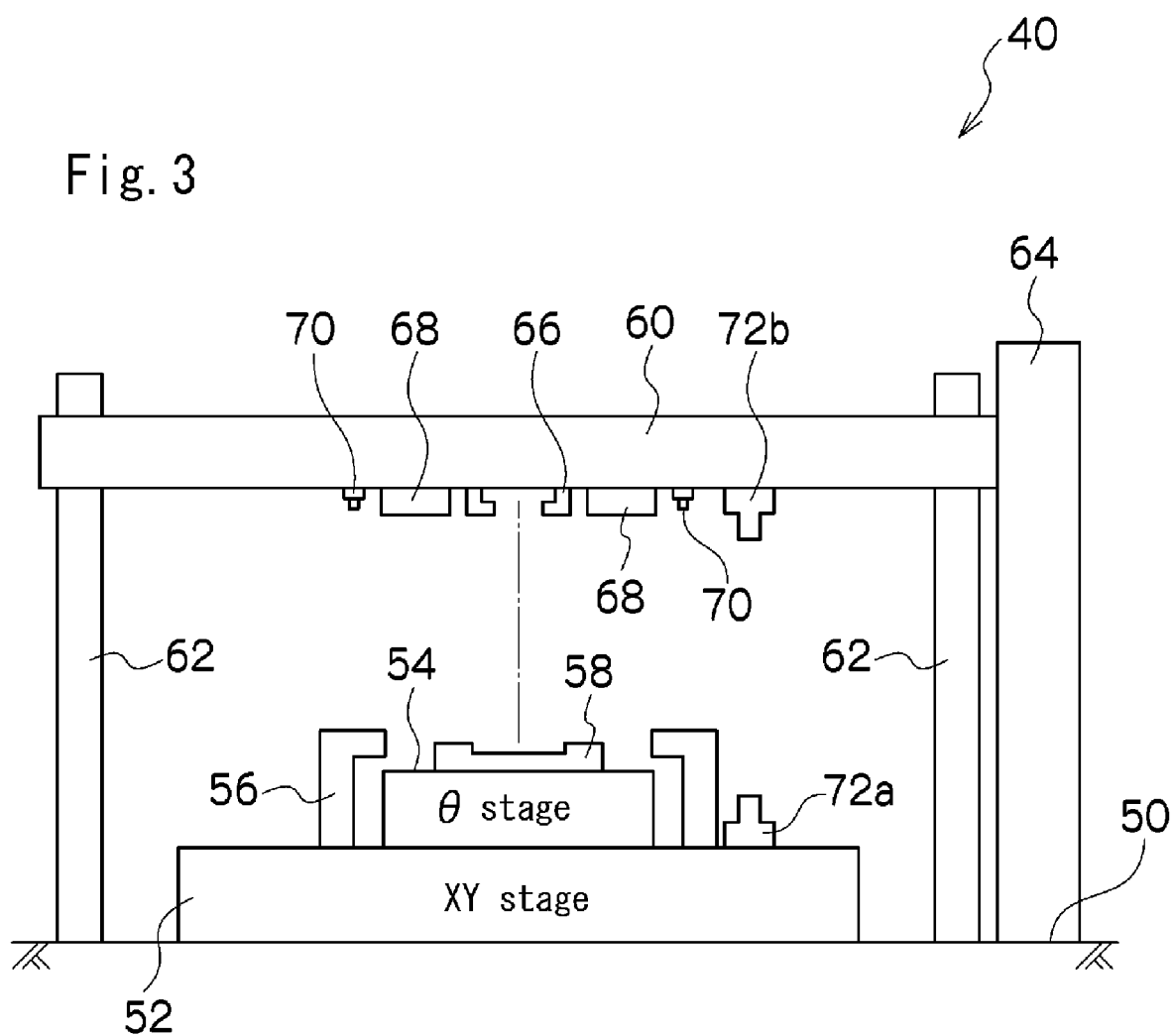
FIG. 3 is a schematic diagram showing an alignment stage used in the burn-in test apparatus shown in FIG. 1.

This alignment stage 40 comprises a conventionally well-known XY stage 52 disposed on a support table 50 and a theta stage 54 provided on the XY stage as shown in FIG. 3. The XY stage 52 can move in the X direction and Y direction intersecting with each other. The theta stage 54 can turn around the Z axis perpendicular to the X direction and the Y direction. On the XY stage 52 is provided a cartridge mounting table 56 receiving the lower cartridge portion 16a, and on the theta stage 54 is provided a chuck fixing unit 58 receiving the rotation axis 14a of the wafer chuck 14 provided in the lower cartridge portion 16a.

Also, on the support table 50, a top plate 60 is supported to be movable in the vertical (Z axis) direction over the theta stage 54 via braces 62. The top plate 60 is moved in the up and down directions by operation of a Z stage 64 provided along the braces 62. The operation of each stage 52, 54, and 64 is controlled by a not shown conventionally well-known control mechanism.

At the center of the lower surface of the top plate 60 is provided a fixing mechanism 66 releasably holding the knob 26 of the upper cartridge portion 16b and are also provided connectors 68 that surround the fixing mechanism 66 and can be connected to the electrical connectors 28. Further, on the lower surface of the top plate 60 are provided unlock mechanisms 70. The unlock mechanism 70 pushes down the upper edge 30a of the hook arm 30 of the upper cartridge portion 16b to move the hook arm 30 to an unlock position.

Also, on the XY stage 52 is provided an upward camera 72a, which is, for example, an autofocus video camera, disposed with its capture lens directing upward, and on the aforementioned lower surface of the top plate 60 is provided a downward camera 72b, which is, for example, an autofocus video camera, disposed with its capture lens directing downward.

The lower cartridge portion 16a is carried in the alignment stage 40 by the first carriage robot 48a, and its circular housing 18a is supported on the cartridge mounting table 56 so that the rotation axis 14a of the wafer chuck 14 is fixed on the chuck fixing unit 58, as shown in FIG. 4(a). On the wafer chuck 14, the semiconductor wafer 12 from the wafer cassette 38 is arranged by the third carriage robot 48c with the aforementioned electrodes directing upward. Also, the upper cartridge portion 16b carried in the alignment stage 40 by the second carriage robot 48b is held on the top plate 60 with the knob 26 by the fixing mechanism 66 so that its electrical connectors 28 are connected to the connectors 68 on the top plate 60, and so that the unlock mechanisms 70 can engage with the upper edges 30a of the hook arms 30.

When the lower cartridge portion 16a is held on the cartridge mounting table 56 in a state where the semiconductor wafer 12 is mounted on its wafer chuck 14, and the upper cartridge portion 16b is held on the top plate 60 by the fixing mechanism 66, an image of the tips of the probes 24a is captured by the upward camera 72a along with the operation of the XY stage 52. Based on this capture image information, the position of the tip of each probe 24a of the probe assembly 24 is checked.

After the tip position of each probe 24a is checked by the upward camera 72a, an image of the aforementioned electrodes on the semiconductor wafer 12 is captured by the downward camera 72b. Based on this capture image, the XY stage 52 and the theta stage 54 are operated for relative alignment between the semiconductor wafer 12 and the probe assembly 24 so that the aforementioned electrodes align with the respective tips of the probes 24a corresponding to the electrodes.

When this alignment is completed, the Z stage 64 is operated, and the top plate 60 is lowered. Along with the lowering of the top plate 60, the upper cartridge portion 16b held on the top plate is lowered so that the probes 24a of its probe assembly 24 are lowered toward the aforementioned corresponding electrodes of the semiconductor wafer 12 in the lower cartridge portion 16a.

As shown in FIG. 4(b), when the probes 24a of the probe assembly 24 contact the aforementioned corresponding electrodes of the semiconductor wafer 12, the hook portions 34 of the upper cartridge portion 16b engage with the lock portions 20 of the lower cartridge portion 16a at approximately the same time as this. Accordingly, the cartridge 16 housing the semiconductor wafer 12 in a state where the probes 24a of the probe assembly 24 contact the aforementioned corresponding electrodes of the semiconductor wafer 12 is formed.

To the connectors 68 of this cartridge 16 is connected the contact tester 46 via wires 74. When the aforementioned electrode to be checked is a signal electrode, the contact tester 46 supplies predetermined current to the probe 24a corresponding to the signal electrode. The contact tester 46 detects voltage of the signal electrode at the time and determines based on the detected voltage weather or not the electrical contact between the signal electrode and the corresponding probe 24a is appropriate. For example, when the detected voltage is a predetermined voltage value, the contact tester 46 determines that the signal probe and the corresponding electrode are in an appropriate contact state.

Also, when the aforementioned electrode to be checked is a power electrode, the contact tester 46 applies predetermined power voltage to the probe 24a corresponding to the power electrode, detects power current at the time, and can determine based on the detected current weather or not the contact between the power electrode and the corresponding probe 24a is appropriate. For example, when the detected current is a predetermined current value, the contact tester 46 determines that the power probe 24a and the corresponding electrode are in an appropriate contact state.

When the contact tester 46 determines that contact of a probe 24a is not appropriate, the unlock mechanisms 70 are operated, and the fixing mechanism 66 is released for cleaning of the probe 24a of the probe assembly 24 attached to the upper cartridge portion 16b. When the upper cartridge portion 16b is released from the lower cartridge portion 16a and the top plate 60 by the release operations of the unlock mechanisms 70 and the fixing mechanism 66, the upper cartridge portion 16b is carried to the cleaning station 44 by the second carriage robot 48b.

In the cleaning station 44, the tip of the probe 24a of the probe assembly 24 in the upper cartridge portion 16b is cleaned by being polished on a polishing plate. Instead of the polishing, the tip may be soaked in cleaning liquid, or clean compressed air may blow to the tip, for the purpose of cleaning of the tip of the probe 24a. After cleaning of the tip, the upper cartridge portion 16b is carried to the alignment stage 40 by the second carriage robot 48b again, is coupled with the lower cartridge portion 16a in the alignment stage 40 in a similar manner to one described above, and then undergoes a re-check by the contact tester 46 on whether or not the electrical connection between the respective probes 24a and the aforementioned corresponding electrodes is appropriate.

When it is confirmed as a result of the check by the contact tester 46 that all the probes 24a of the probe assembly 24 are in appropriate electrical connection relationship with the aforementioned corresponding electrodes, the fixing mechanism 66 is operated to release the knob 26. Also, by the operation of the Z stage 64, the top plate 60 returns to an original position shown in FIG. 4(a).

Subsequently, the cartridge 16 is carried to the test station 42 by the fourth carriage robot 48d. The test station 42 comprises a thermostatic chamber 76 having multistage shelves 76a and a multichannel tester 78, and the inside of the thermostatic chamber 76 is kept in a high temperature appropriate for a burn-in test by a temperature control section 80, as shown in FIG. 5.

On each shelf 76a are provided the fixing mechanisms 66 and the connectors 68 similar to those provided on the top plate 60, and each cartridge 16 is held on the corresponding shelf 76a at its own knob 26 by each fixing mechanism 66. Also, the electrical connectors 28 of each cartridge 16 are connected to the corresponding connectors 68 on the shelf 76a. To each connector 68 is connected the multichannel tester 78 via a wire 82. Thus, each cartridge 16 in the thermostatic chamber 76 is connected to the multichannel tester 78 per measurement channel of the multichannel tester 78. Accordingly, since the semiconductor wafer 12 in each cartridge 16 is held in the thermostatic chamber 76 in a state of being connected to each measurement channel of the multichannel tester 78 via the probes 24a of the probe assembly 24, a burn-in test can be performed in parallel or simultaneously on a plurality of semiconductor wafers 12, and thus an efficient burn-in test is enabled.

Also, according to the present invention, as described above, the cartridge 16 undergoes an electrical determination by the contact tester 46 on whether or not the probes 24a of the probe assembly 24 and the aforementioned corresponding electrodes of the semiconductor wafer 12 are in appropriate contact relationship before it is housed in the thermostatic chamber 76, and only the cartridges 16 determined to be appropriate undergo a burn-in test in the thermostatic chamber 76.

Accordingly, since defects on electrical connection of the probes of the probe assembly can be removed from a burn-in test in advance, reliability of results of a burn-in test can be raised.

The present invention is not limited to the above embodiments but may be altered in various ways without departing from the spirit and scope of the present invention.

What is claimed is:

1. A method for testing a plurality of semiconductor devices in a semiconductor wafer held in a cartridge, wherein each of said semiconductor devices has electrodes and said cartridge has a lower cartridge portion provided with a chuck holding said semiconductor wafer thereon, and an upper cartridge portion provided with a probe assembly having probes capable of contacting said electrodes, said cartridge being constituted by coupling said lower cartridge portion and upper cartridge portion, and then said cartridge being placed in a thermostatic chamber in a state of being connected to a tester, characterized by performing a contact check, after said cartridge is constituted and before said cartridge is disposed in said thermostatic chamber, to determine whether not there is an adequate electrical contact between said electrodes of said semiconductor devices within said cartridge and the probes of said probe assembly.

2. The method according to claim 1, wherein, when appropriate electrical contact cannot be obtained in said contact check, said upper cartridge portion is separated from said cartridge, said probes of said upper cartridge portion are cleaned, then a cartridge including said upper cartridge portion is constituted again, and said contact check is performed.

3. The method according to claim 1, wherein said electrode of said semiconductor device comprises a signal electrode, said probe corresponding to said signal electrode is supplied with predetermined current, voltage of said signal electrode at the time is detected, and based on said detected voltage, whether or not contact between said signal electrode and said probe corresponding to this is appropriate is determined.

4. The method according to claim 1, wherein said electrode of said semiconductor device comprises a power electrode, predetermined power voltage is applied to said probe corresponding to said power electrode, power current at the time is detected, and based on said detected current, whether or not contact between said power electrode and said probe corresponding to this is appropriate is determined.

5. The method according to claim 1, wherein said tester is a multichannel tester having measurement channels respectively corresponding to plural cartridges, said plural cartridges are arranged in said thermostatic chamber, and a plurality of said semiconductor wafers housed in said respective cartridges undergo a test in parallel.

6. A test apparatus comprising an alignment stage for forming a cartridge by coupling a lower cartridge portion provided with a chuck holding a semiconductor wafer on which semiconductor devices having electrodes are integrated with an upper cartridge portion provided with a probe assembly having probes that can contact said electrodes formed on said semiconductor devices of said semiconductor wafer held on said chuck of said lower cartridge portion and a test station having a thermostatic chamber housing said cartridge formed on said alignment stage and a tester performing an electrical test of said semiconductor devices of said semiconductor wafer housed in said cartridge in said thermostatic chamber, wherein said alignment stage is provided with a contact tester to determine whether or not electrical contact between said electrodes of said semiconductor devices integrated on said semiconductor wafer in each cartridge and said probes of said probe assembly is appropriate.

7. The test apparatus according to claim 6, further comprising a cleaning station for cleaning said probe when appropriate electrical contact cannot be obtained in a contact check by said contact tester.

* * * * *